United States Patent [19]

Chao

[11] Patent Number: 4,906,589
[45] Date of Patent: * Mar. 6, 1990

[54] INVERSE-T LDDFET WITH SELF-ALIGNED SILICIDE

[75] Inventor: Fung-Ching Chao, Tainan Shih, Taiwan

[73] Assignee: Industrial Technology Research Institute, Hsin-Chu Hsien, Taiwan

[*] Notice: The portion of the term of this patent subsequent to Apr. 4, 2006 has been disclaimed.

[21] Appl. No.: 307,381

[22] Filed: Feb. 6, 1989

[51] Int. Cl.$^4$ .......................................... H01L 21/265
[52] U.S. Cl. ...................... 437/44; 437/186;
437/233; 437/229; 437/228; 357/23.3; 156/643
[58] Field of Search ............... 437/41, 44, 233, 235,
437/238, 241, 243, 154; 357/23.11, 23.4, 23.9,
23.3, 59, 91; 156/643, 651, 652, 653, 650;
148/DIG. 82, DIG. 83, DIG. 106, DIG. 122

[56] References Cited

U.S. PATENT DOCUMENTS 4,818,715 4/1989 Chao ..................... 437/44

FOREIGN PATENT DOCUMENTS 0161282 12/1979 Japan ..................... 357/23.9
0062367 5/1981 Japan .
0064973 4/1982 Japan .
0220971 12/1984 Japan .
0055665 3/1985 Japan ..................... 437/44
107928 2/1989 Taiwan .

OTHER PUBLICATIONS

Huang et al., "A Novel Submicron LDD Transistor With Inverse-T Gate Structure", IEDM 1986, pp. 742–745.
Ohta et al., "A Quadruply Self-Aligned MOS (QSA MOS) A New Short Channel High Speed High Density MOSFET for VSLI" IEDM 1979, pp. 581–584.

Primary Examiner—Brian E. Hearn
Assistant Examiner—M. Wilczewski
Attorney, Agent, or Firm—Darby & Darby

[57] ABSTRACT

A method of fabricating an inverse-T LDDFET with salicide on a substrate is disclosed. The initial steps include anisotropic silicon nitride and incomplete polysilicon etching steps followed by an n$^-$ ion-implantation process. Then oxide sidewall spacers are formed and the unmasked polysilicon is removed completely. The LDDFET structure is formed by the implantation of ions to form heavily-doped source and drain regions. Thereafter oxide sidewall spacers are removed and the thin polysilicon step is oxidized completely. After the silicon nitride and silicon dioxide layers are removed, the self-aligned silicide is applied to form the inverse-T LDDFET with salicide.

9 Claims, 3 Drawing Sheets

INVERSE-T LDDFET WITH SELF-ALIGNED SILICIDE

BACKGROUND OF THE INVENTION

In order to achieve high circuit performance and density, MOSFET (metal-oxide-semiconductor field effect transistor) devices in silicon integrated circuit technology are scaled down to submicrometer range. In scaling down MOSFETs, the reduction of device dimensions is not accompanied by a corresponding reduction in power requirements. As a result, NMOS (n-channel MOS) devices are susceptible to channel hot-electron (CHE) instability. See Chenming Hu et al., "Hot-Electron-Induced MOSFET Degradation - Model, Monitor and Improvement," *IEEE Transactions on Electron Devices*, Vol. ED-32, No. 2 (Feb. 1985), pp. 375–385. The instability is caused by the very high electric field near the drain junction resulting from the short channel length and high supply voltage.

Another difficulty caused by scaling down is the increase in the resistance of the diffused layers. This results in increased signal delays along diffused interconnects and degrades circuit performance due to the large source/drain series resistance.

To alleviate the high electric field at the reduced MOSFET channel length, lightly doped drain (LDD) devices have been proposed. See K. Saito et al, "A New Short Channel MOSFET with Lightly Doped Drain," *Denshi Tsushin Rengo Taikai* (in Japanese) (April 1978), p. 220. In the LDD structure, narrow, self-aligned, n$^-$ regions are introduced between the channel and the N$^+$ source/drain regions. The N$^-$ region spreads the high electric field out near the drain junction, allowing the device to be operated at a higher supply voltage with fewer hot-electron problems.

Several processes for fabricating lightly-doped drain field effect transistor (LDDFET) have been proposed. Spacer and overhang techniques are most commonly adopted. The spacer technique involves a reactive-ion etching (RIE) step after silicon dioxide is chemical vapor deposited to form side wall oxide spacers. Oxide spacers are used to mask the heavy and deep implant of the N$^+$ drain/source regions after the formation of the shallow n$^-$ drain/source regions. See FIG. 2, p. 590, of Paul J. Tsang et al., "Fabrication of High-Performance LDDFET's with Oxide Sidewall-Spacer Technology," *IEEE Transactions on Electron Devices*, Vol. ED-29, No. 4 (April 1982). The overhang technique involves a polysilicon over-etching step after $SiO_2/Si_3N_4$/poly-Si/$SiO_2$ gate stack is patterned to form $SiO_2/Si_3N_4$ overhangs. $SiO_2/Si_3N_4$ overhangs are used to mask the heavy and deep implant of the n$^+$ drain/source regions followed by the formation of the shallow n$^-$ drain/source regions. See FIG. 2, p. 1360, of Seiki Ogura et al., "Design and Characteristics of the Lightly Doped Drain-Source (LDD) Insulated Gate Field-Effect Transistor," *IEEE Transactions on Electron Devices*, Vol, ED-27, No. 8 (Aug. 1980).

Unfortunately, in the spacer technology, additional oxide deposition and oxide etch-back processes are needed. In the overhang technology, additional $Si_3N_4$/$SiO_2$ deposition and polysilicon over-etching processes are required. In addition, two ion implantation steps are necessary and, therefore, these processes are far too complicated for commercial application.

Two alternative structures, buried LDD and graded/buried LDD structures adopting sidewall oxide spacer technology, have also been demonstrated. See Ching-Yeu Wei et al., "Buried and Graded/Buried LDD Structures for Improved Hot-Electron Reliability," *IEEE Electron Device Letters, Vol. EDL*-7, No. 6 (June 1986), pp. 380–382.

Still another method described is the so-called self-defined polysilicon sidewall (SEPOS) technique which uses $SiO_2$ at the vertical sides of the polysilicon to define the oxide-framed polysilicon sidewall. See FIG. 1, p. 2463, of M. Saitoh, "Degradation Mechanism of Lightly Doped Drain (LDD) n-channel MOSFET's Studied by Ultraviolet Light Irradiation," *J. Electrochem. Soc.: Solid-State Science and Technology*, Vol. 132, No. 10 (Oct. 1985), pp. 2463–2466.

Also proposed has been the self-aligned polysilicon source/drain (SAPSD) technique which uses an N$+$ polysilicon source/drain layer to allow the dopants to diffuse into the substrate to form the n$^-$ region. See FIG. 1, p. 314, of Tiao-Yuan Huang et al., "A MOS Transistor with Self-Aligned Polysilicon Source-Drain," *IEEE Electron Device Letters*, Vol. EDL-7, No. 5 (May 1986), pp. 314–316. In general, all the techniques mentioned above are too difficult and complex processes.

In addition, a new LDD structure for NMOS FET has been demonstrated. It may be made using a single ion implantation step to form n$^-$ regions due to the sloped sidewall of the structure. See FIG. 1, p. 28, of "A New Structure LDD for NMOSFET," *Japan Semiconductor News*, Vol. 3, No. 3 (June 1984), pp. 27–28. Unfortunately, the gate of the FET is much higher than source/drain regions.

Recently, the inverse-T LDD (ITLDD) transistor has been proposed (T. Y. Huang et al., "A Novel Submicron LDD Transistor with Inverse-T Gate Structure," *IEDM* 86 (International Electron and Device Meeting 1986), Sec. 31.7, pp. 742–745). The main feature of the ITLDD transistor is the self-aligned n$^-$ LDD and N$^+$ source/drain implants in the inside and outside edges, respectively, of the inverse-T gate structure. In ITLDD, the spacer-induced degradation in a conventional LDD transistor is eliminated as a result of the self-aligned n$^+$ -to-gate feature. In this scheme, wafers are processes using the conventional process up to the formation of the polysilicon gate pattern. Instead of etching away the entire polysilicon layer as is conventional in the preparation of LDD transistors, the polysilicon etch is deliberately stopped so as to leave a thin polysilicon layer of about 50–100 nm. A phosphorus n$^-$ dose with proper energy is then implanted to form the n$^-$ LDD region and a CVD oxide layer is deposited and anisotropically etched to form an oxide sidewalls-spacer. The oxide sidewall-spacer, as in the case of conventional LDD transistor processing, serves as the mask to offset n$^+$ source/drain implant, allowing optimization of the length of n$^-$ region. A plasma polysilicon etch or a light reoxidation can then be used to strip off (or oxidize) the remaining thin polysilicon. This completes the definition of the inverse-T gate structure, resulting in an oxide sidewall-spacer abutting the ledge of the IT gate. Since the thin polysilicon layer which forms part of the IT gate is protected on the top by the thick oxide sidewall-spacer, it is preserved during reoxidation. A shallow arsenic n$^+$ implant is then performed to form the source/drain region. The n$^+$ source/drain implant is self-aligned to the polysilicon gate and therefore the n+-to-gate offset is eliminated. See FIG. 2, p. 743, of Huang et al., supra.

Another technology to overcome the series resistance problem, known as self-aligned salicide (salicide) technology, has been proposed. This approach reduces device series resistance and enhances interconnects. See C. M. Osburn et al., "High Conductivity Diffusions and Gate Regions using Self-Aligned Silicide Technology," *Electrochemical Society Proceedings*, First International Symposium VLSI Science and Technology, Vol. 82-7 (1982), pp. 213–223. In salicide technology, a gate sidewall oxide is formed which protects the gate sidewall from shorting to the source/drain regions after salicidation. The gate sidewall oxide if formed either by depositing and anisotropically etching a CVD oxide layer or by selective oxidation of sidewalls of the gate on which there is a layer of silicon nitride. See FIG. 1 and FIG. 2, p. 222, of C. M. Osburn et al., "High Conductivity Diffusions and Gate Regions Using Self-Aligned Silicide Technology," *Electrochemical Society Proceedings*, First International Symposium VLSI Science and Technology, Vol. 82-7, 1982.

Combining LDD with salicide technologies has been reported. See FIG. 6, p. 347, of Fang-Shi J. Lai et al., "Design and Characteristics of a Lightly Doped Drain (LDD) Device Fabricated with Self-Aligned Titanium Disilicide," *IEEE Transactions on Electron Devices*, Vol. ED-33, No. 3 (March 1986), pp. 345–353. However, the fabrication of the LDDFET requires additional depositing and etching of chemical vapor deposited films and two ion implantation steps. Accordingly, the process is far too complicated.

SUMMARY OF THE PRESENT INVENTION

In accordance with the present invention, an improved method of making an inverse-T lightly-doped drain field effect transistor (LDDFET) has been discovered. In this process, self-aligned silicide (salicide) is used to make a novel LDDFET.

A high quality silicon dioxide layer is thermally grown on a silicon wafer, and a polysilicon layer is then deposited over the thermal oxide layer. An n+ diffusion step is performed to dope the polysilicon layer and a silicon nitride layer is deposited thereon. The photoresist mask having a polysilicon gate pattern is then applied using conventional photoresist coating and optical lithography techniques. A first dry etching step is performed in which silicon nitride is removed completely and polysilicon is anisotropically etched to a proper thickness. Then the photoresist masking layer is stripped and a phosphorus n− dose with proper energy is implanted to form the n− LDD region. A CVD oxide layer is deposited and anisotropically etched to form oxide sidewall spacers. Thereafter, an anisotropic etch is applied to remove the remaining thin polysilicon. A shallow arsenic n+ implant is then performed to form the source/drain region. These steps complete the formation of the LDDFET.

After the oxide sidewall spacer is removed, an oxidation process is performed to oxidize the thin polysilicon steps completely. The silicon nitride layer and silicon dioxide layers on the source/drain regions are removed, leaving the polysilicon dioxide around the side wall of the polysilicon gate. Thereafter, a thin layer of metal is deposited to form metal silicide at both polysilicon gate and source/drain regions. A selective etchant is then used to remove the unreacted metal, but not the metal silicides, to form the LDDFET with salicide.

By following the process of the invention, an FET can be fabricated which has the advantages of both LDD and silicide technologies. This is made possible by forming the silicon nitride layer on top of the gate so that, when the sidewalls are oxidized to form the spacers, the top portion is left untouched. Furthermore, when the silicon nitride is subsequently etched, the spacers are left undisturbed. Hence, two of the most significant problems in scaling down MOSFETs, namely, channel hot-electron instability and series resistance, are minimized.

DESCRIPTION OF THE DRAWINGS

FIG. 1 shows the structure after the initial coating steps wherein the silicon wafer is first coated with a thin, thermally-coated silicon dioxide layer, an n-doped polysilicon layer, and a silicon nitride layer having on top of it a defined photoresist mask layer with the gate pattern.

FIG. 2 shows the structure after the anisotropic etch of the silicon nitride layer and a part of the polysilicon layer followed by an ion implantation with lightly n-type dopants.

FIG. 3 shows the structure after spacers are formed on the vertical faces of the central portion of the polysilicon layer and the silicon nitride layer and on portions of the horizontal thin polysilicon layer adjacent to the central portion.

FIG. 4 shows the structure after the unmasked portion of the polysilicon layer is removed.

FIG. 5 shows the implantation of the heavy dose of ions to form source and drain regions.

FIG. 6 shows the structure remaining after the spacer silicon dioxide layer is removed. The inverse-T polysilicon gate having a silicon nitride layer atop the central portion is shown.

FIG. 7 shows the structure resulting from the oxidation of the thin polysilicon steps illustrating the formation of the sidewall polysilicon dioxide spacers.

FIG. 8 shows the structure after the removal of the silicon nitride layer.

FIG. 9 shows the structure after the removal of the silicon dioxide layers from the source/drain regions.

FIG. 10 illustrates the LDDFET with salicides formed over the gate and source/drain regions.

DETAILED DESCRIPTION OF THE INVENTION

According to the present invention, an improved method of fabricating the inverse-T lightly doped drain field effect transistor (LDDFET) with self-aligned silicide (salicide) is described. This technique finds particular application in the processing of silicon wafers for integrated circuit chips. Accordingly, the invention will be described for this particular application.

Figure 1:
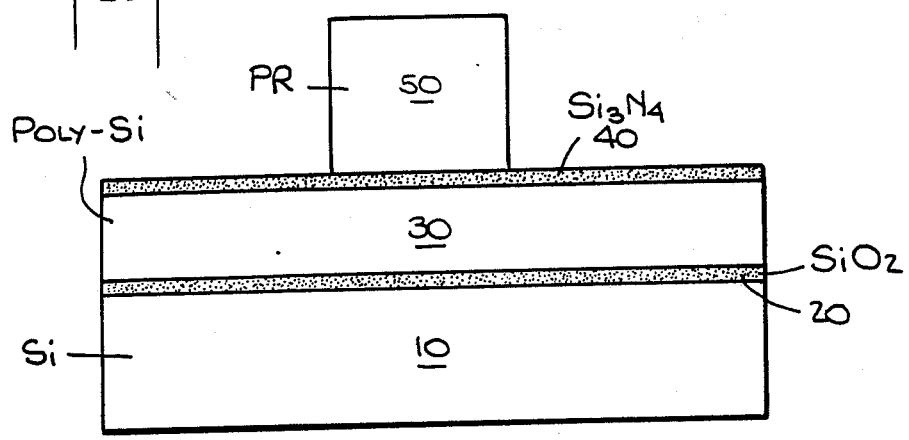
FIGS. 1 to 10 show transverse sectional views of the structure formed at various stages in the fabrication of the LDDFET in accordance with the invention.

Referring now to the drawings, FIG. 1 shows a section through the silicon wafer after the initial processing steps. The silicon wafer, designated by the reference character 10, has grown thereon a thin film of silicon dioxide ($SiO_2$), 20. On top of the $SiO_2$ is a layer of doped polysilicon, 30, which has been doped using in-situ chemical vapor deposition (CVD) or a diffusion process. On top of the polysilicon 30 is a layer of silicon nitride, 40, which is deposited using conventional low pressure chemical vapor deposition (LPCVD) or plasma-enhanced chemical vapor deposition (PECVD). On top of the silicon nitride 40 is a photoresist masking layer, 50, having a polysilicon gate pattern. This pattern is defined using standard photoresist coating, exposure and development processes.

Figure 2:
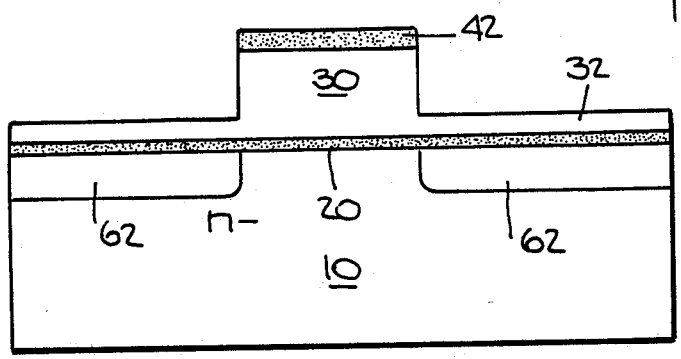

FIG. 2 shows the resulting structure after the unmasked portions of silicon nitride 40 and a part of polysilicon 30 are etched anisotropically, the photoresist layer 50 is removed, and n− ions are implanted to form the n− LDD region. The anisotropic etching can be performed using the reactive-ion etching system, for example, AME-8110 system (trademark of Applied Material Co.). The silicon nitride etching is performed using 60 SCCM (standard cubic centimeters per minute) of $CHF_3$ and 35 SCCM of $O_2$ at a pressure of 40 milli-torr and a power of 600 watts. This gives an etch rate of about $630\pm10$ Angstroms/min. For polysilicon etching, 65 SCCM of Ar and 20 SCCM of $NF_3$, a pressure of 40 milli-torr and a D.C. bias of −230 V are preferred, with the etch rate being about $250\pm15$ Angstroms/min. The amount of the polysilicon layer removed is carefully determined, typically 700 Angstroms. The remainder of the unmasked polysilicon layer, designated by the reference character 32, is left on the silicon dioxide and the remainder of the silicon nitride, designated by the reference character 42, is left on the polysilicon. This layer 42 serves as the oxidation resist layer during the subsequent polysilicon oxidation step.

As can be seen from FIG. 2, the n− LDD region, designated by the reference character 62, is formed under the thin polysilicon 32. The n− ion implantation process can be performed, for example, using a phosphorus dopant, $1\times10^{13}$ doses/$cm^2$, 60 kilo electron volts energy.

Figure 3:
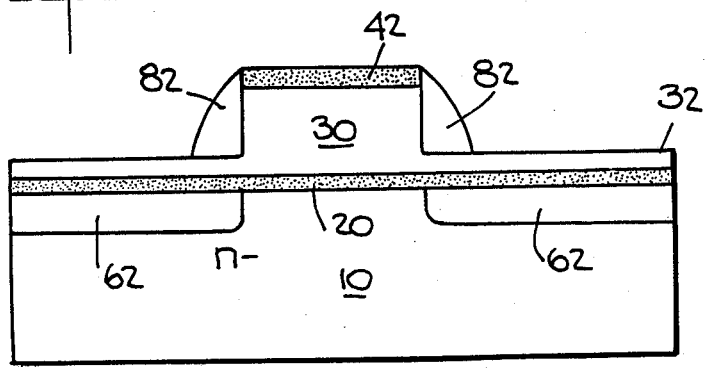

As illustrated in FIG. 3, the next step is to chemically vapor deposit a silicon oxide layer over the surface of the structure shown in FIG. 2. Thereafter, using anisotropic etching, preferably reactive ion etching, spacers 82 are formed which cover the vertical surfaces of the silicon nitride and the thick central portion of the polysilicon layer as well as a defined portion of the horizontal surface of the thin polysilicon layer. The sequence of CVD deposition of silicon dioxide followed by reactive ion etching is referred to as spacer technology. This is described in *IEEE*, Vol. ED-29, No. 4, p. 590.

Figure 4:
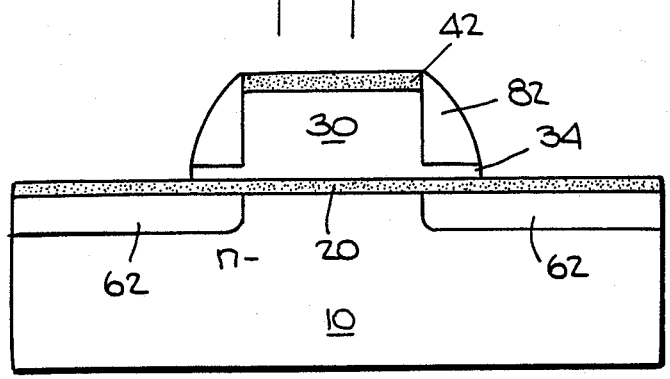

The next step in the process is the removal of the entire unmasked polysilicon layer 32. The residual polysilicon is illustrated in FIG. 4 and comprises a thick central portion 30 and a thin step 34.

The polysilicon step 34 is the remainder of the exposed unetched polysilicon 32 after this etching process. The length of the polysilicon step 34 under spacers 82 corresponds to the length of lightly-doped regions and is designed to be in the range of 0.25–0.30 micrometer for standard applications.

Figure 5:
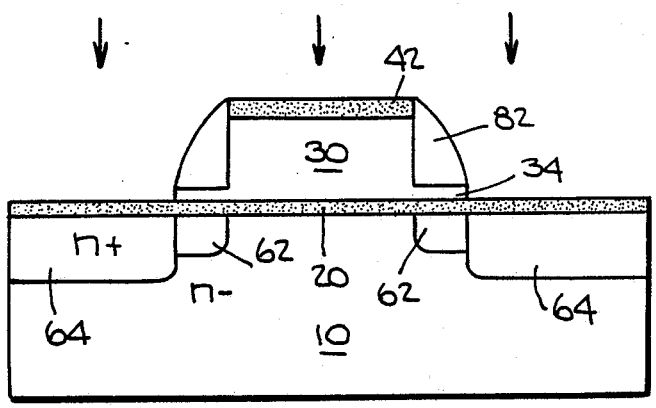

FIG. 5 shows the resulting structure after the source/drain region is doped by ion implantation. The n+ source/drain ion implantation process can be performed, for example, using an arsenic dopant, $6\times10^{15}$ doses/$cm^2$, 60 kilo electron volts energy. As can be seen from the figure, the portions outside the inverse-T polysilicon gate regions are unmasked and therefore the implanting dopants penetrate far into the silicon to form the highly-doped source/drain regions 64. The portion of the silicon under the polysilicon step 34, being completely masked by the spacer and the thin polysilicon, are not penetrated by the n+ dopant, leaving lightly-doped source/drain regions 62 unchanged. The portion under the thick polysilicon gate region 30 and the silicon nitride layer 42 is completely masked and, therefore, the implanting dopants are prevented from reaching the silicon substrate in the gate region.

Figure 6:
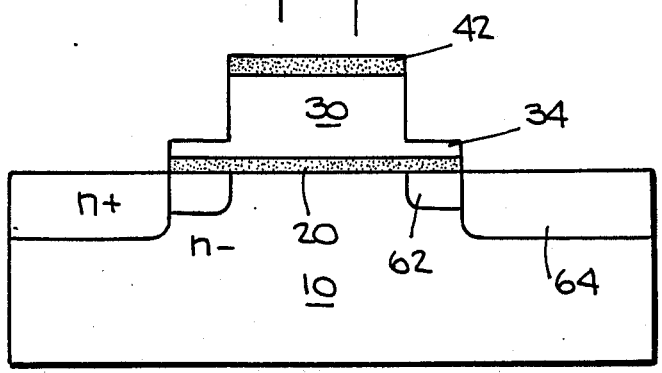

After the LDDFET is fabricated, the salicide process is commenced. FIG. 6 shows the resulting structure after the spacers are removed. As can be seen, there is a silicon nitride layer on top of the polysilicon gate. This is an essential feature in the process for making an LDDFET with salicide.

Figure 7:
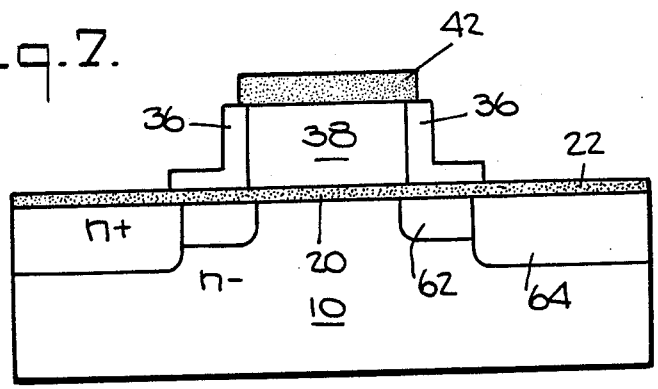

FIG. 7 shows the resulting structure after the thin polysilicon step 34 is completely oxidized. The layer of the polysilicon dioxide 36 is about twice as thick as the thin polysilicon step 34 from which it was formed. In this example, a 1400 Angstrom polysilicon dioxide layer is obtained by oxidizing the 700 Angstrom polysilicon layer. The silicon dioxide layer, formed at the sidewall of the gate, protects the gate sidewall from shorting to source/drain regions during the salicidation process. In addition, the silicon nitride layer 42 prevents the oxidation of the top of the polysilicon layer 30 because the former is highly oxidation-resistant. The polysilicon gate, after oxidation, is designated by the reference character 38. The silicon dioxide formed over the source/drain regions is designated by the reference character 22. The oxidation process can be performed by exposing the structure to oxygen for 5 min., to a mixture of oxygen and hydrogen chloride for 45 min., and to nitrogen for 15 min. in a furnace at 920° C.

Figure 8:
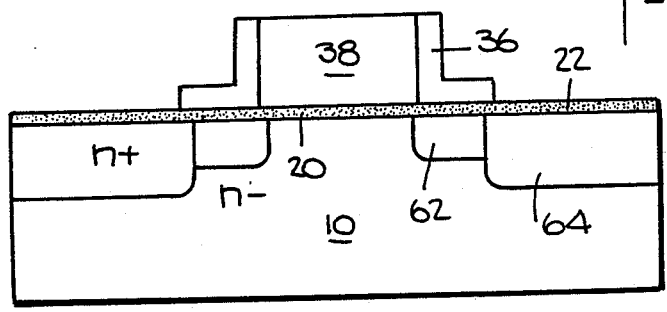

FIG. 8 shows the resulting structure after the silicon nitride layer 42 is removed. This is accomplished by using a dry etching process, as for example by introducing 60 SCCM of $CHF_3$ and 35 SCCM of $O_2$ into AME-8110 system at a pressure of 40 milli-torr and a power of 600 watts. Under these conditions an etch rate of about $630\pm10$ Angstrom/min. is achieved.

Figure 9:
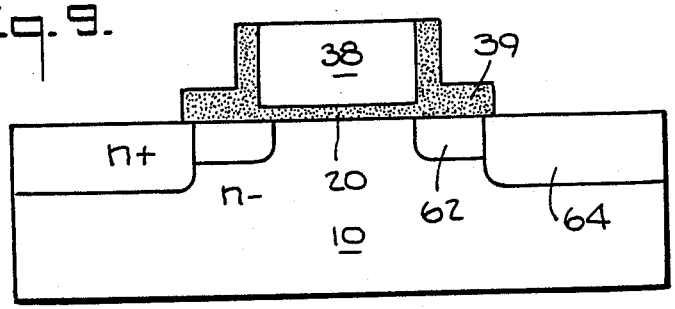

FIG. 9 shows the resulting structure after the silicon dioxide layers 22 are removed by using, for example, a diluted HF solution. During this step a portion of polysilicon dioxide layer 36, corresponding in thickness with the silicon dioxide layer 22, is also removed. The remainder of the polysilicon dioxide layer is designated by the reference character 39.

Figure 10:
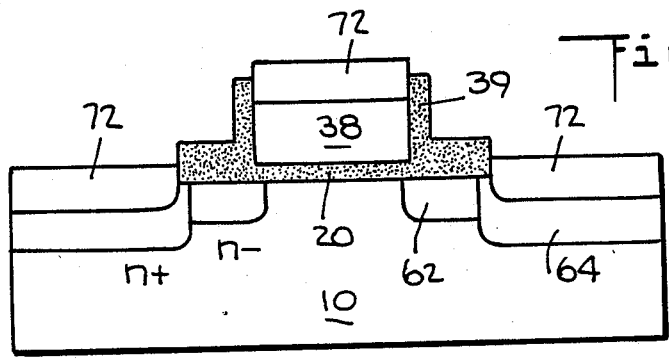

FIG. 10 shows the resulting structure after self-aligned silicide layers are formed. The first step in this process is the deposition of a metal film over the wafer. The silicide is then formed by reacting the metal with the silicon in a selected atmosphere at a selected temperature to anneal the structure. Finally, the unreacted metal is removed by a selective wet etch process that etches metal without attacking silicide or polysilicon dioxide, thereby leaving silicides 72 on the gate, source and drain regions. As an example of the foregoing, $TiSi_2$ (titanium disilicide) is formed at temperature of about 600°–700° C. The selective etch is accomplished using a mixed solution of one part $H_2O_2$, one part $NJ_4OH$ and five parts $H_2O$. A second anneal after etching is performed at 800° C. See C. Y. Ting et al., "The Use of $TiSi_2$ in a Self-Aligned Silicide Technology," *Electrochemical Society, Proceedings of First International Symposium on VLSI Science and Technology* (1982), pp. 224–231 and C. Y. Ting, "Silicide for Contacts and Interconnects," IEDM 84 (International Electron Device Meeting 1984), Sec. 5.1, pp. 110–113.

The key features of the LDDFET with salicide are now achieved. By performing conventional low temperature oxidation, contact window opening, metallization and passivation processes, the LDDFET with salicide is ready for practical applications.

In the description of the embodiments of the invention set forth above, it is assumed that the isolation region (for NMOS) or well and isolation regions (for CMOS) have already been formed in accordance with conventional procedures.

It will be understood that only NMOS devices have the hot-electron instability problem; accordingly, the inverse-T LDDFET with salicide would only be used to fabricate n-channel MOSFETs.

The foregoing description is for purpose of illustration only. It will be readily understood that many variations thereof, which will not depart from the spirit of the invention, will be apprarent to those skilled in the art.

What is claimed is:

1. A process for preparing a lightly-doped drain field effect transistor with self-aligned silicide which comprises:
   a. defining a gate pattern by means of a photoresist mask on the silicon nitride layer of a laminate comprising a semiconductor substrate having deposited thereon successively a gate oxide layer, a polysilicon layer, and said silicon nitride layer;
   b. removing completely the unmasked silicon nitride layer and partially removing the unmasked polysilicon layer by anisotropically etching said layers and then stripping the photoresist layer;
   c. ion-implanting the resultant structure to form lightly-doped source/drain regions under said partially-etched polysilicon layer;
   d. depositing a CVD SiO₂ layer followed by an anisotropic etching to form oxide sidewall spacers;
   e. anisotropically etching the unmasked polysilicon completely to form a polysilicon layer having a relatively thick central portion and a relatively thin peripheral step and to expose a portion of the gate oxide layer of said laminate;
   f. ion-implanting the resultant structure to form source/drain regions under said exposed portions of said gate oxide layer;
   g. removing the sidewall spacers;
   h. oxidizing completely the thin peripheral polysilicon step and the sidewalls of the polysilicon central portion;
   i. removing the silicon nitride layer so as to expose the top surface of the gate region;
   j. removing the silicon dioxide layer on the source/drain regions so as to form a structure having polysilicon dioxide spacers on the side walls of said gate and having exposed source/drain regions; and
   k. forming self-aligned silicide layers on the exposed source/drain regions and the exposed gate region.

2. The process of claim 1 wherein the semiconductor substrate is a p-type silicon wafer.

3. The process of claim 1 wherein the field effect transistor is of the n-channel type.

4. The process of claim 1 wherein the anisotropic etching steps are performed by dry etching.

5. The process of claim 1 wherein the silicon nitride is deposited by low pressure chemical vapor deposition or plasma-enhanced chemical vapor deposition.

6. The process of claim 1 wherein the dopant in the ion-implantation process is arsenic or phosphorus.

7. The process of claim 1 wherein the self-aligned silicide layers are formed by deposition a reactive metal, selectively etching the unreacted metal, and annealing the substrate.

8. The process of claim 7 wherein the metal is titanium, molybdenum, platinum, cobalt, nickel, palladium tungsten, tantalum or niobium.

9. The process of claim 1 wherein the polysilicon is doped using an in-situ doping or a diffusion process.

* * * * *